United States Patent [19]
Lien

[11] Patent Number: 5,644,459
[45] Date of Patent: Jul. 1, 1997

[54] BIPOLARITY ELECTROSTATIC DISCHARGE PROTECTION DEVICE AND METHOD FOR MAKING SAME

[75] Inventor: Chuen-Der Lien, Los Altos Hills, Calif.

[73] Assignee: Integrated Devices Technology, Santa Clara, Calif.

[21] Appl. No.: 551,995

[22] Filed: Nov. 2, 1995

[51] Int. Cl.[6] .................................................. H02H 9/00
[52] U.S. Cl. .................................. 361/56; 361/111
[58] Field of Search ........................ 361/56, 111, 91; 257/355–360

[56] References Cited

U.S. PATENT DOCUMENTS

| | | | |
|---|---|---|---|
| 4,424,544 | 1/1984 | Chang et al. | 361/56 |
| 4,484,244 | 11/1984 | Avery | 361/56 |
| 4,689,711 | 8/1987 | Conzelmann et al. | 361/91 |
| 4,750,078 | 6/1988 | Ganger et al. | 361/56 |
| 4,930,036 | 5/1990 | Sitch | 316/56 |
| 5,086,365 | 2/1992 | Lien | 361/58 |
| 5,200,876 | 4/1993 | Takeda et al. | 361/91 |
| 5,212,618 | 5/1993 | O'Neill et al. | 361/56 |
| 5,272,363 | 12/1993 | Pezzani | 257/173 |

*Primary Examiner*—Jeffrey A. Gaffin
*Assistant Examiner*—Michael J. Sherry
*Attorney, Agent, or Firm*—Skjerven, Morrill, MacPherson, Franklin & Friel

[57] ABSTRACT

A circuit and method for protecting an integrated circuit during positive and negative ESD events. During both positive and negative ESD events, the circuit conducts ESD current through a turned on device. The circuit includes a pad, a voltage supply rail, a field effect transistor connected across the pad and the voltage supply rail, and an enabling circuit connected across the gate of the field effect transistor and the pad. During a positive ESD event, the field effect transistor is turned on to provide a conductive path between the pad and the voltage supply rail. During a negative ESD event, the bipolar transistor inherent in the field effect transistor is turned on to provide a conductive path between the pad and the voltage supply rail.

19 Claims, 6 Drawing Sheets

BIPOLARITY ELECTROSTATIC DISCHARGE PROTECTION DEVICE AND METHOD FOR MAKING SAME

FIELD OF THE INVENTION

This invention relates to a semiconductor structure which provides electrostatic discharge protection to an integrated circuit.

BACKGROUND OF THE INVENTION

Integrated circuits (ICs) are generally susceptible to damage from electrostatic discharge (ESD) events. An ESD event typically occurs when an IC is handled by human beings or by machines. During the ESD event, a large voltage is applied across pads of the IC. To avoid damage to the IC during an ESD event, ESD protection devices are typically fabricated on the IC and connected to the pads of the IC. The ESD protection devices provide discharge paths so that the internal circuits of the IC are not damaged during the ESD event.

FIG. 1 is a schematic diagram of a typical prior art ESD protection circuit 101. Input pad 102 is connected to input buffer 103, which in turn is connected to other elements of the integrated circuit. ESD protection circuit 101 includes a p-channel pull-up transistor 104 and an n-channel pull-down transistor 105. Pull-up transistor 104 has a drain and gate coupled to the $V_{CC}$ voltage supply rail and a source coupled to input pad 102. Pull-down transistor 105 has a drain coupled to input pad 102 and a source and gate coupled to the ground supply rail.

ESD events can result in the application of either a positive or negative voltage pulse to pad 102. This voltage pulse is connected either across pad 102 and the $V_{CC}$ supply rail or across pad 102 and the ground supply rail. A positive ESD pulse applied across pad 102 and the ground supply rail will tend to induce n-junction breakdown in grounded gate n-channel ESD transistor 105, while a negative ESD pulse applied across pad 102 and the ground supply rail will cause the n-junction which exists between the drain and the substrate of transistor 105 to turn on, thereby enabling transistor 105 to conduct current as a parasitic bipolar transistor. Conversely, a positive ESD pulse applied across pad 102 and the $V_{CC}$ supply rail will turn on the p-junction of which exists between the source and the substrate of transistor 104, while a negative ESD pulse applied across pad 102 and the ground supply rail will tend to induce p-junction breakdown in p-channel ESD transistor 104.

In general, ESD protection circuit 101 provides better ESD protection when an ESD transistor is operating in turn-on mode, rather than breakdown mode. This is because operating an ESD transistor in breakdown mode results in a non-uniform current distribution which is very sensitive to any defect or process variation affecting breakdown voltage. As a result of this non-uniform current distribution, ESD transistors can be locally destroyed when operated in breakdown mode. In contrast, when ESD transistor is operated in turn-on mode, the ESD transistor has a uniform current distribution which is insensitive to defects or process variations.

Moreover, the breakdown voltage of an ESD transistor is generally more than 10 volts, while the turn-on voltage of the same transistor is typically less than 5 volts. The higher voltage experienced when operating in breakdown mode results in a greater heating effect within the ESD transistor, when compared with the heating effect experienced when operating in turn-on mode (for a given amount of ESD charge).

While circuit 101 allows transistors 104 and 105 to operate in turn-on mode for certain ESD events, the maximum positive voltage which can be applied to pad 102 during normal operation is limited to approximately Vcc plus 0.5 volts. If the applied voltage exceeds this level, transistor 104 turns on and current flows from pad 102 to the $V_{CC}$ supply rail of the IC through p-channel transistor 104. Normally, this is not allowed in IC operation specifications. The limitation of a maximum pad voltage is particularly undesirable in ICs having a $V_{CC}$ supply voltage of 3.3 volts or lower. Generally, IC users would like to have a 3.3 volt IC which can receive a 5.5 volt voltage when interfacing with an IC having a $V_{CC}$ supply voltage of 5 volts.

It would therefore be desirable to have an ESD structure which turns on for both positive and negative ESD pulses and which turns on at voltage levels which are low enough to prevent excessive heating and high enough to prevent the pad from shorting to the supply rails during normal operating conditions.

SUMMARY

Accordingly, the present invention provides a bipolarity ESD protection circuit which turns on during both positive and negative ESD pulses to protect an integrated circuit. This ESD protection circuit includes a first field effect transistor which is connected across a pad of the integrated circuit and a first voltage supply rail of the integrated circuit. A first enabling circuit connects the pad to the gate of the first transistor. A parasitic bipolar transistor inherent in the first transistor provides a conductive path between the pad and the first voltage supply rail when an ESD voltage having a first polarity is applied across the pad and the first voltage supply rail. When an ESD voltage having a second polarity opposite the first polarity and exceeding the maximum normal operating voltage of the integrated circuit is applied across the pad and the first voltage supply rail, the first enabling circuit turns on the first transistor, thereby providing a conductive path between the pad and the first voltage supply rail.

Because the ESD protection circuit conducts the ESD current through a turned on circuit element in response to both positive and negative ESD events, the ESD protection circuit of the present invention is less likely to be damaged than prior art ESD protection circuits.

In another embodiment, the ESD protection circuit includes a second field effect transistor connected across the pad and a second voltage supply rail of the integrated circuit. A second enabling circuit connects the pad to the gate of the second transistor. The second transistor and the second enabling circuit operate in the same manner as the first transistor and the first enabling circuit to protect the integrated circuit against positive and negative ESD events across the pad and the second voltage supply rail.

In a particular embodiment, the first enabling circuit includes a plurality of transistors, each having gate-to-drain connections, connected in series between the pad and the gate of the first transistor. The number of series transistors used, along with the threshold voltages of these transistors, is controlled to assure that the first transistor is not turned on unless the voltage applied across the pad and the first voltage supply rail exceeds the maximum operating voltage.

In another embodiment, the first enabling circuit includes a third field effect transistor connected across the pad and the gate of the first transistor. The third transistor is designed to have a shorter gate length than the first transistor. As a result, the third transistor will operate in breakdown or punch-through mode when an ESD voltage having the second polarity is applied across the pad and the first voltage supply rail. The charge passed by the third transistor turns on the first transistor, which in turn conducts the ESD current.

Logic circuits can be connected to the gate of the first transistor and to the enabling circuit to control these elements during normal operation of the integrated circuit. In one variation, a logic circuit provides a signal to the gate of the first transistor to ensure that the first transistor is turned off during normal operating conditions. In another variation, a logic circuit provides a signal to the enabling circuit to ensure that the first transistor is turned off during normal operating conditions. In yet another variation, the logic circuit connected to the gate of the first transistor transmits a signal that causes the connection and disconnection of the pad to the first voltage supply rail, in the manner of an output driver circuit.

The invention also includes a method for protecting an integrated circuit when an ESD voltage is applied across a pad and a voltage supply rail of the integrated circuit. This method includes the steps of (1) routing ESD current through a field effect transistor by parasitic bipolar effect when the ESD voltage has a first polarity, and (2) turning on the field effect transistor to route ESD current through the field effect transistor when the ESD voltage has a second polarity opposite the first polarity and exceeds the maximum normal operating voltage.

The present invention will be more fully understood in light of the following detailed description taken together with the drawings.

BRIEF DESCRIPTION OF THE DRAWINGS

FIG. 2c is a schematic diagram of a variation of the ESD protection circuit of FIG. 2a;

FIG. 3b is a schematic diagram of a variation of the ESD protection circuit of FIG. 3a;

FIG. 4b is a schematic diagram of a variation of the ESD protection circuit of FIG. 4a;

FIG. 5b is a schematic diagram of a variation of the ESD protection circuit of FIG. 5a.

DETAILED DESCRIPTION

Figure 1:
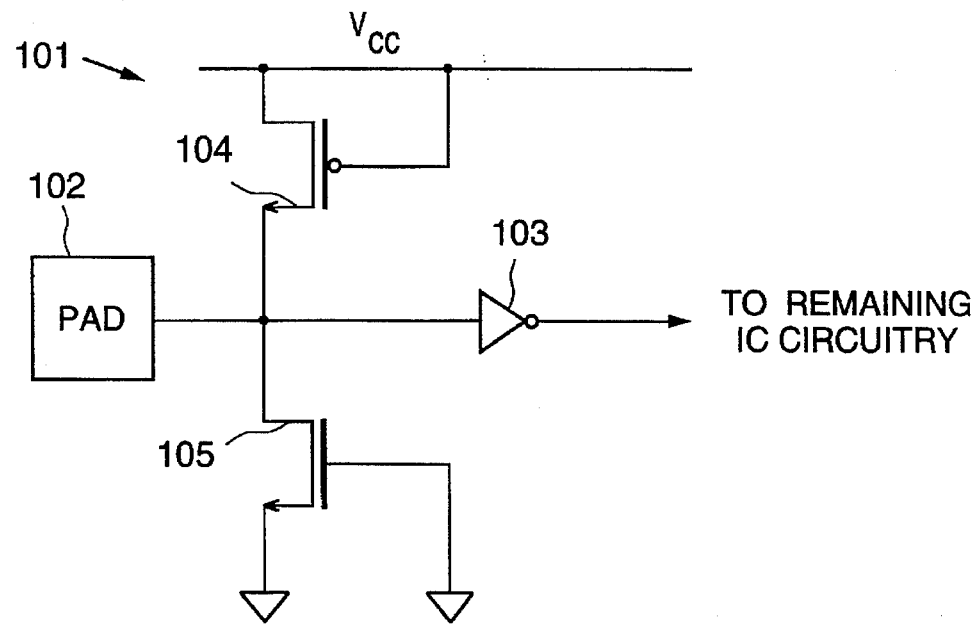
FIG. 1 is a schematic diagram of a prior art ESD protection circuit.
Figure 2A:
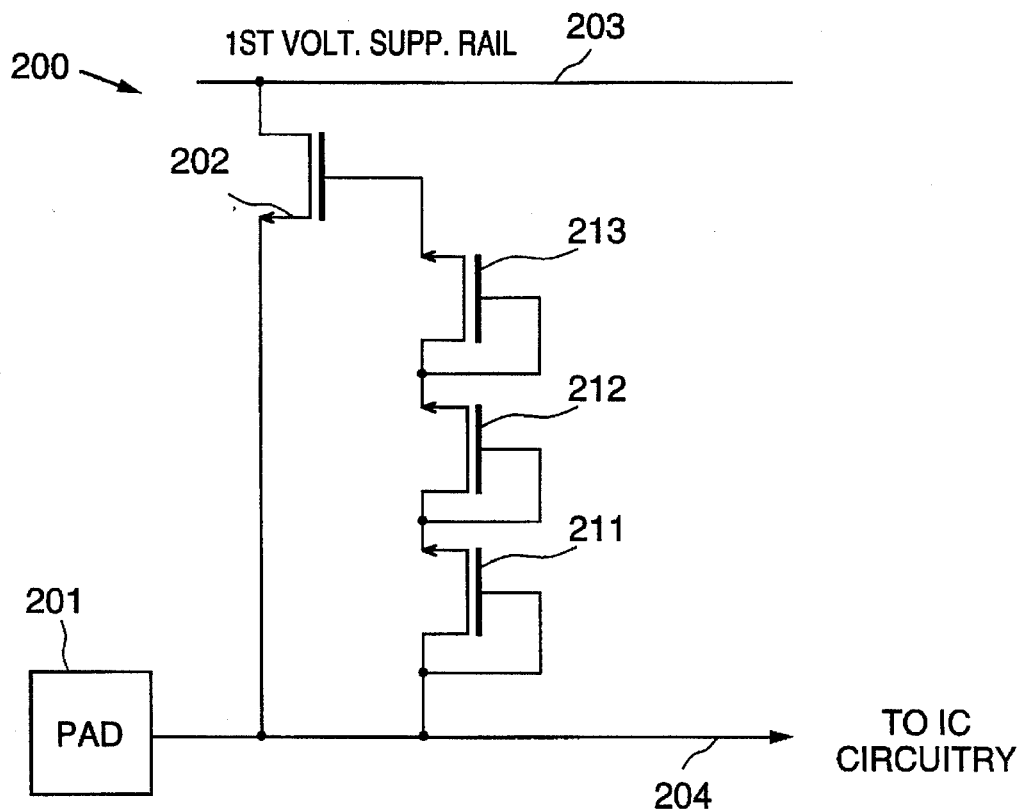
FIG. 2a is a schematic diagram of an ESD protection circuit in accordance with one embodiment of the invention.

FIG. 2a is a schematic diagram of an ESD protection circuit 200 in accordance with one embodiment of the invention. ESD protection circuit 200 includes pad 201, n-channel insulated gate field effect transistors 202 and 211–213, first voltage supply rail 203 and circuit line 204. The drain of n-channel transistor 202 is connected to first voltage supply rail 203 and the source of transistor 202 is connected to circuit line 204. The sources and drains of transistors 211–213 are connected in series between circuit line 204 and the gate of transistor 202 as illustrated. Each of transistors 211–213 includes a gate-to-drain connection. These gate-to-drain connections cause transistors 211–213 to act as diodes which are forward biased by a voltage on circuit line 204 which is positive with respect to the voltage at the gate of transistor 202.

First voltage supply rail 203 can be either a $V_{CC}$ supply voltage rail, which is connected to a supply voltage, $V_{CC}$, during normal operation of the IC, or a ground supply voltage rail, which is connected to ground during normal operation of the IC.

Circuit line 204 extends to other circuitry of the IC (not shown). ESD protection circuit 200 protects this other circuitry during an ESD event. An ESD event, as defined herein, refers to the application of a relatively large voltage across pad 201 and first voltage supply rail 203 with respect to the voltage applied across pad 201 and first supply rail 203 during normal operating conditions. The ESD event is a positive ESD event if the polarity of the applied voltage is positive at pad 201. Conversely, the ESD event is a negative ESD event if the polarity of the applied voltage is negative at pad 201.

ESD protection circuit 200 operates as follows during ESD events. A positive ESD pulse at pad 201 causes transistors 211–213 to sequentially turn on. As a result, positive charges are provided to the gate of transistor 202, thereby turning on transistor 202. Once turned on, transistor 202 provides a conductive path between pad 201 and first supply rail 203. ESD protection circuit 200 thereby provides for ESD discharge through a turned on device during a positive ESD event.

ESD protection circuit 200 is designed so that a relatively high positive voltage can be applied to pad 201 without turning on ESD protection circuit 200. The positive voltage at which ESD protection circuit 200 turns on can be selected by selecting the number of transistors connected in series between circuit line 204 and the gate of transistor 202 and/or selecting the threshold voltages of these transistors. The positive voltage at which ESD protection circuit 200 turns on should be greater than the maximum operating voltage selected for the IC. For ICs having a higher maximum operating voltage, additional transistors are connected in series between circuit line 204 and the gate of transistor 202 and/or the threshold voltages of these transistors are increased.

In the illustrated embodiment, three transistors 211–213 are connected in series between circuit line 204 and the gate of transistor 202. If each of transistors 211–213 is fabricated in a single, grounded p-well, the threshold voltage of each of transistors 211–213 is approximately 0.8 to 1 volt in a 5 volt system or 0.55 to 0.6 volts in a 3.3 volt system. Because these threshold voltages are inadequate to provide the desired maximum operating voltage, a positive back bias voltage is applied to the p-well during normal operation, thereby increasing the threshold voltages of transistors 211–213 to the appropriate level. If the p-well is to remain grounded, additional transistors are added in series with transistors 211–213 to provide the desired turn on voltage for ESD protection circuit 200.

In an alternative embodiment, transistors 211–213 are fabricated in separate p-well regions. Each of these separate p-wells is shorted to the source of the transistor fabricated in the p-well. Again, the p-wells can be grounded or a positive back bias voltage can be applied to these p-wells.

Figure 2B:
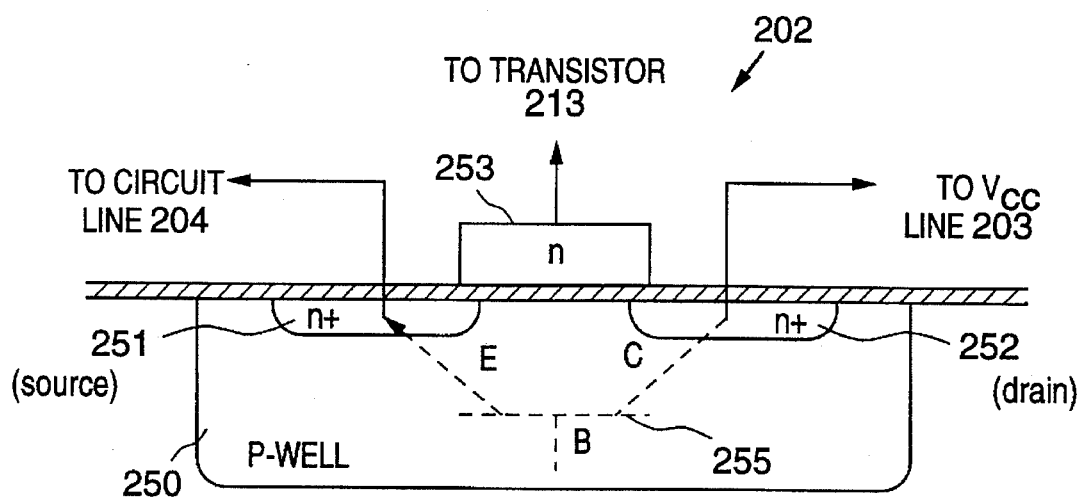
FIG. 2b is a cross sectional schematic diagram illustrating a parasitic bipolar transistor existing within a field effect transistor.

During a negative ESD event at pad 201, ESD protection circuit 200 operates as follows. Inherent in the structure of NMOS transistor 202 is a parasitic bipolar transistor. FIG. 2b is a cross sectional schematic diagram of transistor 202 illustrating how such a parasitic bipolar transistor 255 is formed. Transistor 202 includes p-well 250, source region 251, drain region 252 and gate electrode 253. Source region 251 is coupled to circuit line 204, drain region 252 is connected to first supply rail 203, and gate electrode 253 is connected to the source of transistor 213. P-well 250, source region 251 and drain region 252 form the base B, emitter E and collector C, respectively, of NPN parasitic bipolar transistor 255. In one embodiment, p-well 250 is coupled to a ground supply rail (which may or may not correspond to first voltage supply rail 203). When a negative ESD voltage is applied to pad 201, the base-emitter junction of parasitic bipolar transistor 255 is forward biased, thereby turning on this transistor 255. The turn on voltage of bipolar transistor 255 is approximately 0.8 to 1.2 volts. The negative ESD voltage is discharged between pad 201 and first supply rail 203 through parasitic transistor 255.

During normal operation of the IC, negative voltages are not applied to pad 201. That is, the voltage at pad 201 varies from a positive voltage, $V_{CC}$ to ground. Thus, during normal operation, parasitic bipolar transistor 255 does not turn on.

In the foregoing manner, ESD protection circuit 200 provides protection for positive and negative ESD events. During both positive and negative ESD events, ESD protection circuit 200 provides a discharge path through a circuit element which is turned on. Moreover, the positive voltage at which ESD protection circuit 200 turns on can be adjusted by selecting the number and/or threshold voltages of the transistors connected in series between circuit line 204 and the gate of transistor 202.

Figure 2C:
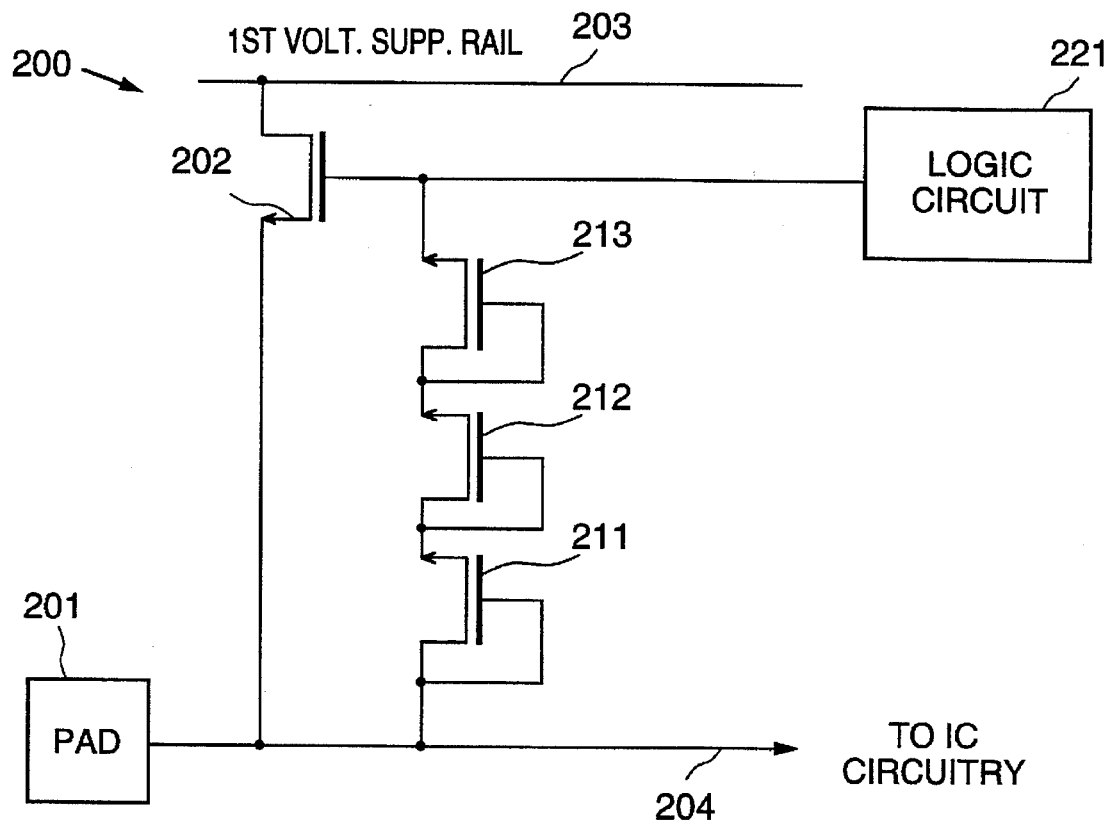

FIG. 2c illustrates a variation of ESD protection circuit 200. In this variation, logic circuit 221 of the IC is coupled to the gate of transistor 202. In one embodiment, logic circuit 221 provides a logic low signal to the gate of transistor 202 during normal operation of the IC, thereby assuring that transistor 202 is turned off and minimizing leakage current through transistor 202. In another embodiment, pad 201 is an output pad, and logic circuit 221 is an output driver which provides logic high and low signals to the gate of transistor 202, thereby causing transistor 202 to connect and disconnect first supply rail 203 and pad 201. In this embodiment, similar circuitry (not shown here, but described in more detail in connection with FIG. 6) is used to connect and disconnect pad 201 to a second supply voltage, thereby providing an output driver for the IC. Other functions of logic circuit 211 would be apparent to those skilled in the art.

Figure 3A:
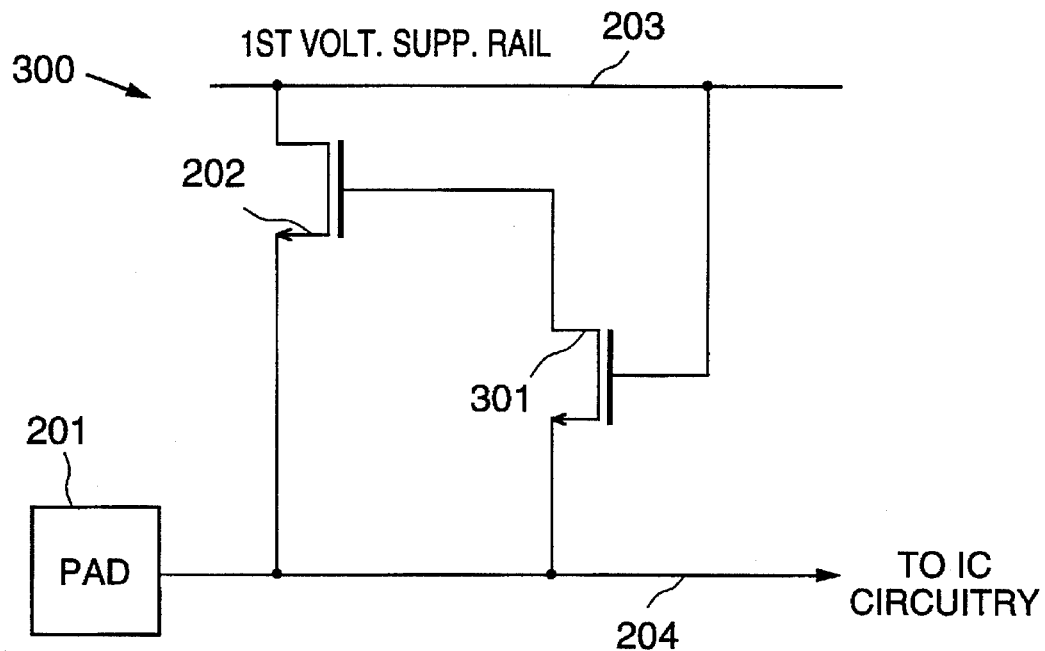
FIG. 3a is a schematic diagram of an ESD protection circuit in accordance with another embodiment of the invention.

FIG. 3a is a schematic diagram of ESD protection circuit 300 in accordance with another embodiment of the invention. Similar elements in ESD protection circuits 200 and 300 are labeled with similar reference numbers. Thus, ESD protection circuit 300 includes pad 201, n-channel FET 202, first voltage supply rail 203, circuit line 204. ESD protection circuit 300 also includes n-channel FET 301, which has a source coupled to circuit line 204, a drain coupled to the gate of transistor 202, and a gate coupled to first supply rail 203. Transistor 301 is fabricated with a shorter gate length than transistor 202. As a result, transistor 301 has a lower breakdown or punch-through voltage than transistor 202.

During a positive ESD event, transistor 301 enters breakdown or punch-through mode to conduct a small amount of charge to the gate of transistor 202, thereby turning on transistor 202. As a result, a conductive ESD path is provided between pad 201 and first supply rail 203 through transistor 202.

During a negative ESD event, the parasitic bipolar transistor 255 inherent in transistor 202 turns on to provide a conductive path between first supply rail 203 and pad 201 in the manner previously described in connection with FIGS. 2a and 2b.

Thus, ESD protection circuit 300 advantageously provides conductive discharge paths for both positive and negative ESD events through turned on circuit elements.

Figure 3B:
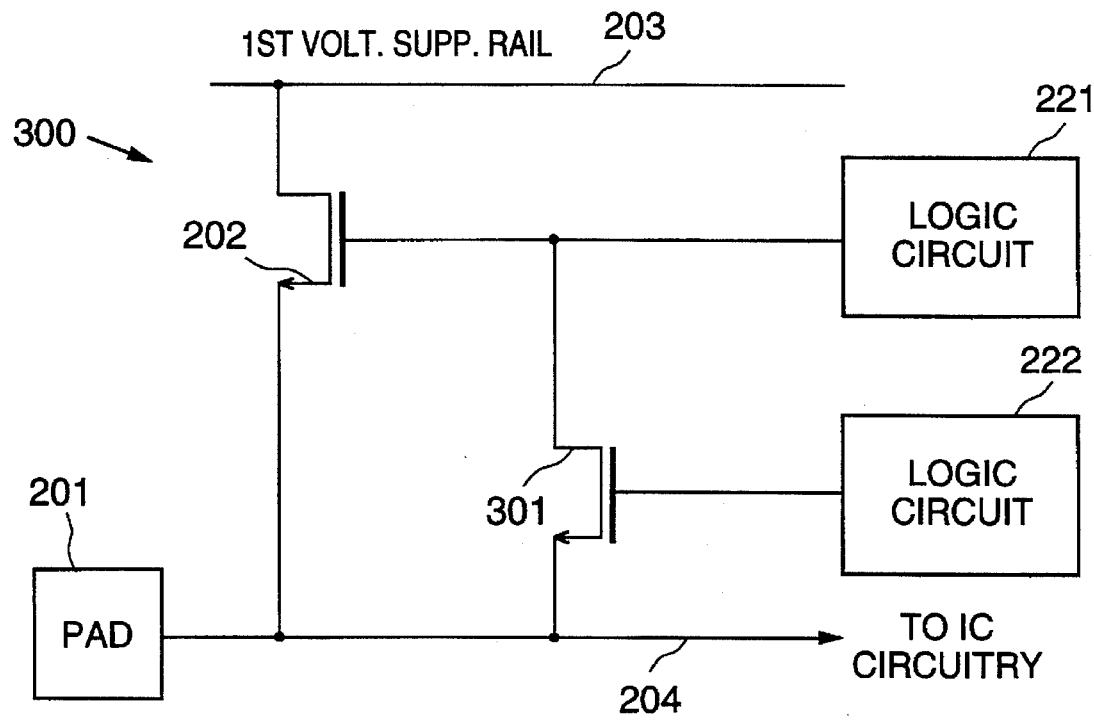

FIG. 3b illustrates a variation of ESD protection circuit 300. In this variation, the gate electrode of transistor 202 is coupled to logic circuit 221 and the gate electrode of transistor 301 is coupled to logic circuit 222. Logic circuit 221 operates in accordance with one of the variations previously described in connection with FIG. 2c. In another variation, logic circuit 221 leaves the gate of transistor 202 floating, and logic circuit 222 provides a logic high signal to the gate of transistor 301, thereby turning on transistor 301 and shorting the gate and source of transistor 202. This prevents transistor 202 from being turned on during normal operation of the IC.

Figure 4A:
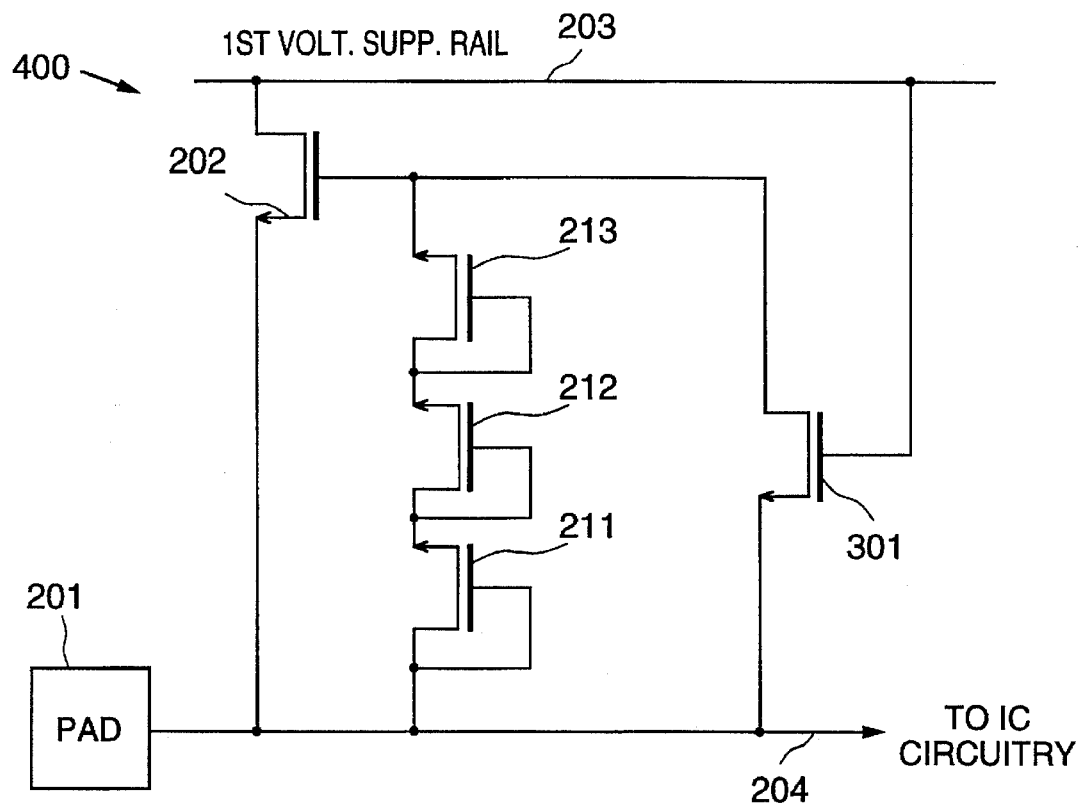
FIG. 4a is a schematic diagram of an ESD protection circuit in accordance with another embodiment of the invention.

FIG. 4a is a schematic diagram of ESD protection circuit 400 in accordance with another embodiment of the invention. ESD protection circuit 400 combines n-channel transistors 211–213 from ESD protection circuit 200 (FIG. 2a) with n-channel transistor 301 from ESD protection circuit 300 (FIG. 3a). Transistors 211–213 operate in the manner previously described in connection with ESD protection circuit 200, and in parallel, transistor 301 operates in the manner previously described in connection with ESD protection circuit 300. Thus, during a positive ESD event, transistors 211–213 turn on and transistor 301 enters breakdown or punch-through mode to provide charge to the gate electrode of transistor 202. As a result, transistor 202 is turned on to conduct ESD current. During a negative ESD event, the parasitic bipolar transistor 255 inherent in transistor 202 turns on to conduct ESD current.

Figure 4B:
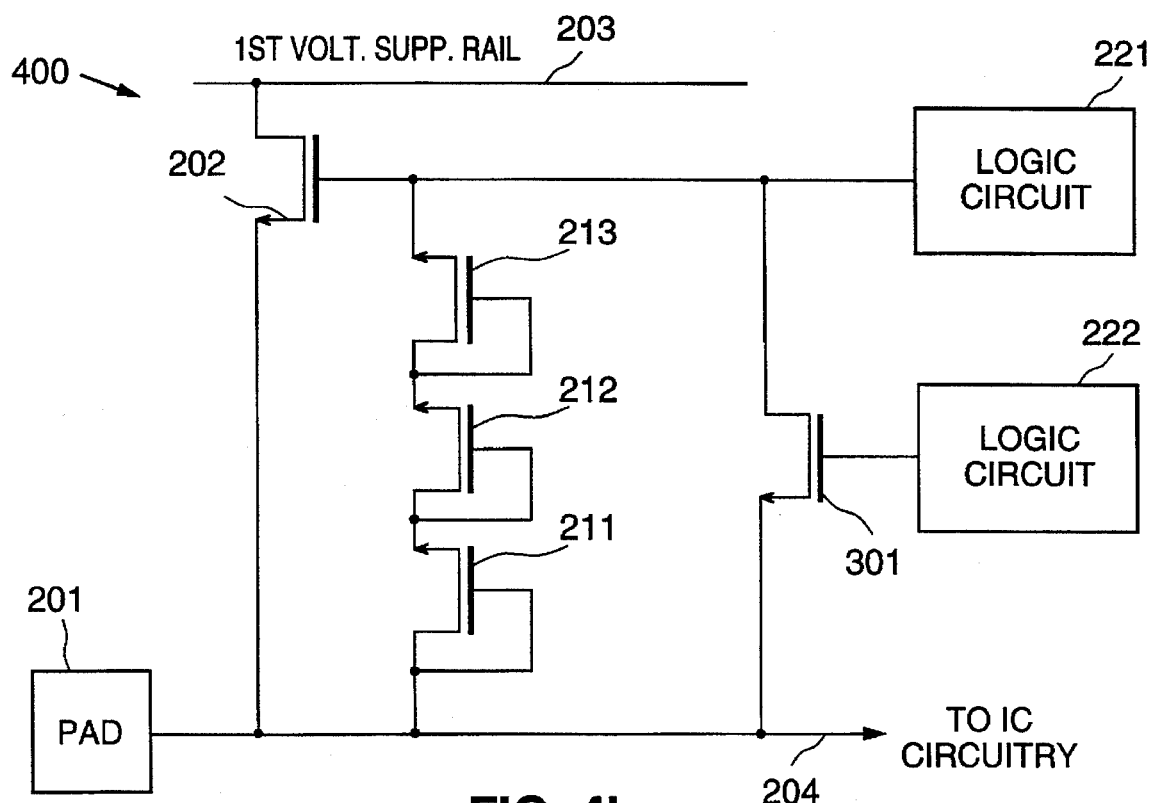

FIG. 4b illustrates a variation of ESD protection circuit 400, in which logic circuit 221 is connected to the drain of transistor 303, the source of transistor 213 and the gate of transistor 202. Logic circuit 222 is connected to the gate of transistor 301. Logic circuits 221 and 222 are operated as previously described in connection with ESD protection circuits 200 (FIG. 2c) and 300 (FIG. 3b).

Figure 5A:
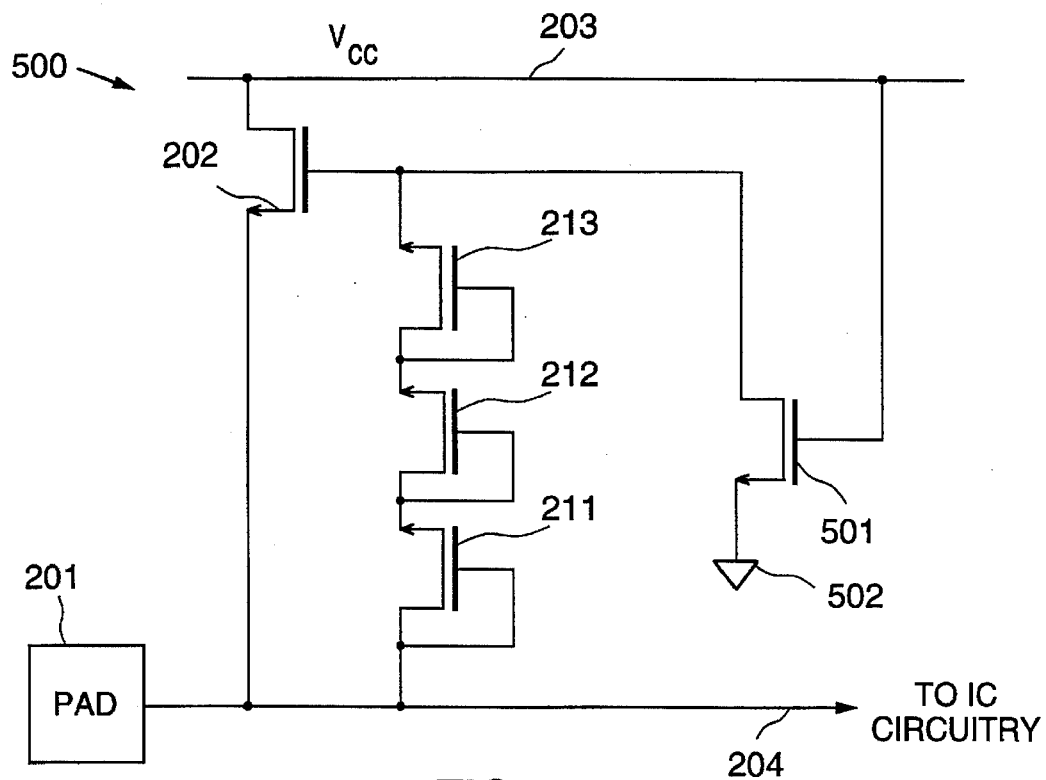
FIG. 5a is a schematic diagram of an ESD protection circuit in accordance with another embodiment of the invention.

FIG. 5a is a schematic diagram of ESD protection circuit 500 in accordance with another embodiment of the invention. ESD protection circuit 500 is similar to ESD protection circuit 200 (FIG. 2a). Thus, similar elements in ESD protection circuits 200 and 500 are labeled with similar reference numbers. In addition to the elements of ESD protection circuit 200, ESD protection circuit 500 includes an n-channel field effect transistor 501 having a source connected to a ground supply rail 502, a drain connected to the gate of transistor 202 and a gate coupled to first supply rail 203. In this embodiment, first supply rail 203 is a $V_{CC}$ voltage supply rail. In this configuration, transistor 501 is not particularly useful for providing protection during positive or negative ESD events. However, during normal operating conditions, transistor 501 is turned on by the positive $V_{CC}$ voltage received from first supply rail 203. As a result, the gate of transistor 202 is connected to ground supply rail 502 during normal operating conditions. This advantageously turns transistor 202 off and prevents current from leaking between pad 201 and first supply rail 203 during normal operating conditions.

Figure 5B:
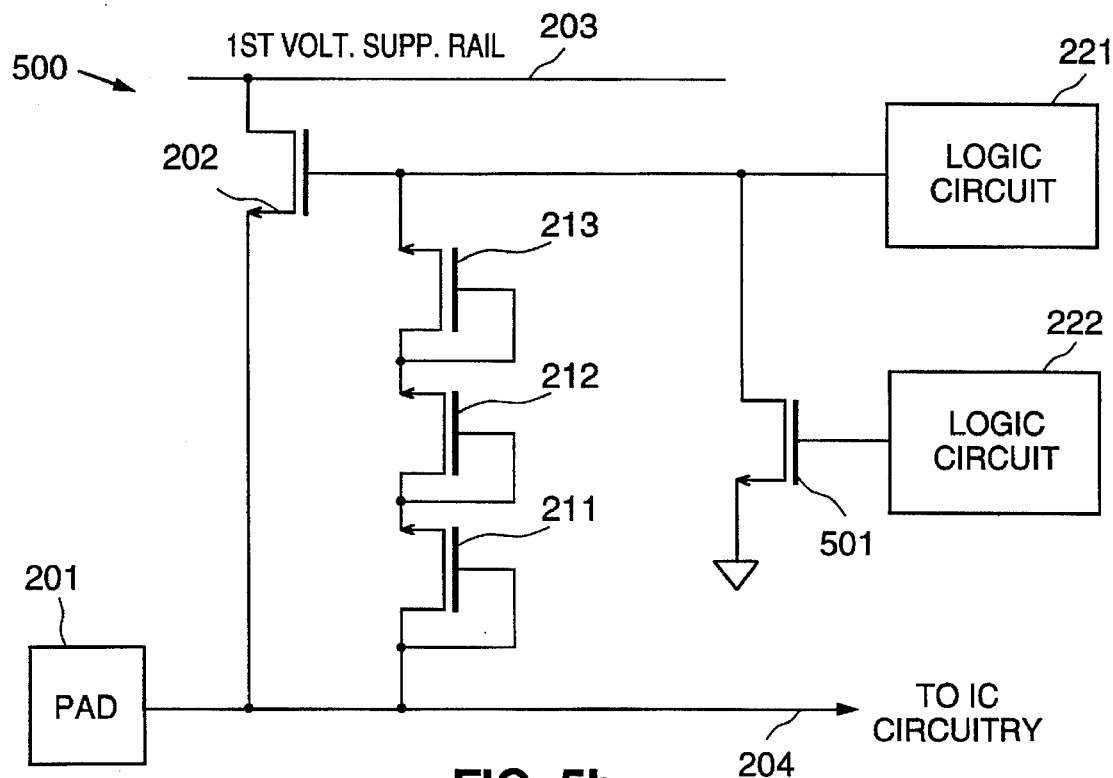

FIG. 5b is a schematic diagram illustrating a variation of ESD protection circuit 500. In this variation, the gate of transistor 501 is connected to logic circuit 222, rather than first supply rail 203. Logic circuit 221 is connected to the gate of transistor 202 and the source of transistor 213. In one variation, logic circuit 222 provides a logic high signal during normal operation of the IC and logic circuit 211 is left in a floating state. In this variation, transistor 501 connects the gate of transistor 202 to ground supply rail 502, thereby preventing transistor 202 from turning on during normal operating conditions. In another variation, logic circuit 222 provides a logic low signal to the gate of transistor 501, thereby turning off transistor 501. This effectively removes transistor 501 from ESD protection circuit 500, and allows logic circuit 211 to operate in accordance with the variations previously described in connection with ESD protection circuit 200 (FIG. 2c).

Figure 6:
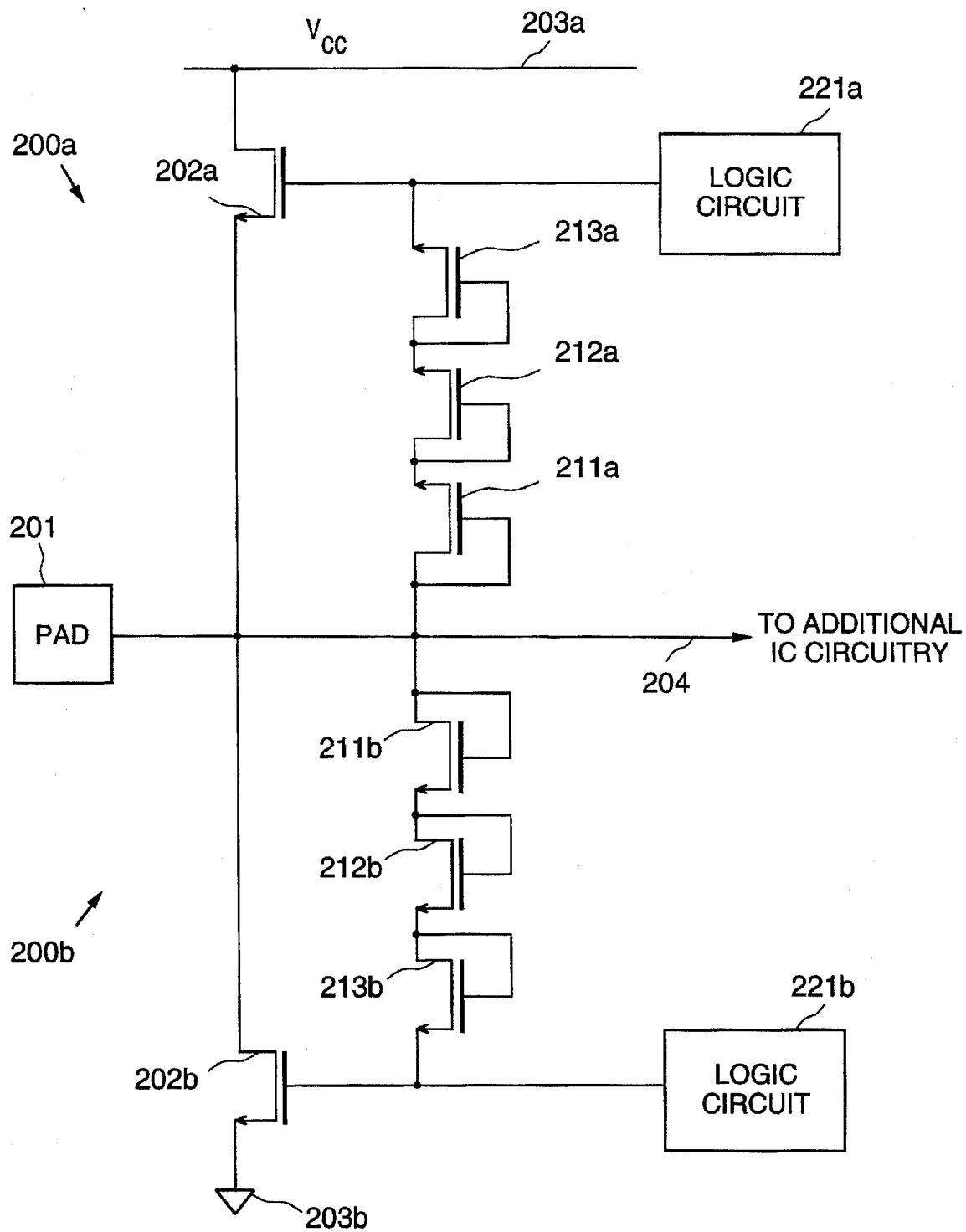
FIG. 6 is a schematic diagram of an ESD protection circuit which is coupled to both a $V_{CC}$ voltage supply rail and a ground supply rail.

FIG. 6 is a schematic diagram of an ESD protection circuit 600 in accordance with yet another embodiment of the invention. ESD protection circuit 600 includes ESD protection circuits 200a and 200b, each of which is identical to ESD protection circuit 200 (previously described in connection with FIG. 2c). In FIG. 6, the elements of ESD protection circuit 200 are slightly renumbered, such that the elements of ESD protection circuit 200a include the reference character "a", and the elements of ESD protection circuit 200b include the reference character "b". Each of ESD protection circuits 200a and 200b is connected to circuit line 204 (and pad 201).

ESD protection circuit 200i a, which is shown above circuit line 204, includes a first voltage supply rail 203a which is coupled to a $V_{CC}$ voltage supply during normal operating conditions (i.e., a $V_{CC}$ voltage supply rail). ESD protection circuit 200b, which is shown below circuit line 204, includes a first voltage supply rail 203b which is coupled to ground during normal operating conditions (i.e., a ground supply rail). ESD protection circuit 200a operates in the manner previously described in connection with ESD protection circuit 200 (FIG. 2c) to provide protection for positive and negative ESD events which occur across pad 201 and $V_{CC}$ voltage supply rail 203a. In a similar manner, ESD protection circuit 200b provides protection for positive and negative ESD events which occur across pad 201 and ground voltage supply rail 203b.

In a particular embodiment, during normal operation of the IC, pad 201 is operated as an output pad. In this embodiment, logic circuits 221a and 221b and transistors 202a and 202b act as output drivers. To provide a logic high signal (i.e., $V_{CC}$) to output pad 201, logic circuit 221a provides a logic high signal to the gate of transistor 202a, and logic circuit 221b provides a logic low signal to the gate of transistor 202b, thereby connecting pad 201 to $V_{CC}$ supply rail 203a through transistor 202a. Similarly, to provide a logic low signal (i.e., ground) to output pad 201, logic circuit 221a provides a logic low signal to the gate of transistor 202a, and logic circuit 221b provides a logic high signal to the gate of transistor 202b, thereby connecting pad 201 to ground supply rails 203b through transistor 202b.

In yet other embodiments of the invention, the previously described ESD protection circuits 200, 300, 400, and 500 can be combined to provide additional ESD protection circuits. For example, an ESD protection circuit can include any one of ESD protection circuits 200, 300, 400 and 500 connected between circuit line 204 and a $V_{CC}$ voltage supply rail, plus any one of ESD protection circuits connected between circuit line 204 and a ground supply rail. ESD protection circuit 600 illustrates one of these possible combinations. Moreover, an ESD protection circuit can include a plurality ESD protection circuits 200, 300, 400 and 500 connected in parallel between circuit line 204 and first supply rail 203. Such a configuration will result in a reduced current density through the parallel protection devices.

Although the invention has been described in connection with several embodiments, it is understood that this invention is not limited to the embodiments disclosed, but is capable of various modifications which would be apparent to a person skilled in the art. For example, the specific conductivity types presented in the described embodiments can be reversed to achieve similar results. Furthermore, the protected pad can be an input pad or an output pad. Thus, the invention is limited only by the following claims.

I claim:

1. An electrostatic discharge (ESD) protection circuit for protecting an integrated circuit fabricated on a chip, the ESD protection circuit comprising:

a pad connected to the integrated circuit to be protected;

a first voltage supply rail;

a first field effect transistor connected across the pad and the first voltage supply rail, wherein the first field effect transistor provides a conductive path between the pad and the first voltage supply rail by a parasitic bipolar effect when a voltage having a first polarity exists across the pad and the first voltage supply rail; and a first enabling circuit coupled between a gate of the first field effect transistor and the pad, wherein the first enabling circuit turns on the first field effect transistor when a voltage having a second polarity opposite the first polarity and exceeding a preselected voltage exists across the pad and the first voltage supply rail, thereby providing a conductive path between the pad and the first voltage supply rail.

2. The ESD protection circuit of claim 1, wherein the pad, first voltage supply rail and first enabling circuit are fabricated on the chip.

3. The ESD protection circuit of claim 1, wherein the first enabling circuit comprises a plurality of transistors connected in series between the pad and the gate of the first field effect transistor.

4. The ESD protection circuit of claim 3, wherein each of the plurality of transistors includes a gate-to-drain connection.

5. The ESD protection device of claim 3, wherein the gate of the first field effect transistor has a first length, wherein the first enabling circuit further comprises:

a second field effect transistor connected across the gate of the first field effect transistor and the pad, the second field effect transistor having a gate coupled to the first voltage supply rail, wherein the gate of the second field effect transistor has a second length which is less than the first length.

6. The ESD protection circuit of claim 3, wherein the gate of the first field effect transistor has a first length, wherein the first enabling circuit comprises:

a logic circuit; and a second field effect transistor connected across the gate of the first field effect transistor and the pad, the second field effect transistor having a gate coupled to the logic circuit, wherein the gate of the second field effect transistor has a second length which is less than the first length, and wherein the logic circuit provides a signal to the gate of the second field effect transistor which turns on the second field effect transistor during normal operation of the integrated circuit.

7. The ESD protection circuit of claim 3, wherein the gate of the first field effect transistor has a first length, wherein the first enabling circuit comprises:

a first logic circuit connected to the gate of the first field effect transistor;

a second logic circuit; and a second field effect transistor connected across the gate of the first field effect transistor and the pad, the second field effect transistor having a gate coupled to the second logic circuit, wherein the gate of the second field effect transistor has a second length which is less than the first length, and wherein during normal operation of the integrated circuit the second logic circuit provides a signal to the gate of the second field effect transistor which turns off the second field effect transistor and the first logic circuit provides a signal to the gate of the first field effect transistor which causes the first field effect transistor to turn on and off.

8. The ESD protection circuit of claim 3, further comprising:

a second voltage supply rail; and a second field effect transistor connected across the gate of the first field effect transistor and the second voltage supply rail, the second field effect transistor having a gate connected to the first supply rail.

9. The ESD protection circuit of claim 3, further comprising:

a second voltage supply rail;

a logic circuit; and a second field effect transistor connected across the gate of the first field effect transistor and the second voltage supply rail, the second field effect transistor having a gate connected to the logic circuit, wherein during normal operating conditions, the logic circuit provides a signal which turns on the second field effect transistor.

10. The ESD protection circuit of claim 3, further comprising:

a second voltage supply rail;

a first logic circuit connected to the gate of the first field effect transistor;

a second logic circuit; and a second field effect transistor connected across the gate of the first field effect transistor and the second voltage supply rail, the second field effect transistor having a gate connected to the logic circuit, wherein during normal operating conditions, the second logic circuit provides a signal which turns off the second field effect transistor and the first logic circuit provides a signal to control the first field effect transistor.

11. The ESD protection circuit of claim 1, further comprising a logic circuit coupled to the gate of the first field effect transistor.

12. The ESD protection circuit of claim 11, wherein the logic circuit provides a signal having a first state to the gate of the first field effect transistor during normal operation of the integrated circuit.

13. The ESD protection circuit of claim 11, wherein the logic circuit provides a signal having a both a first state and a second state to the gate of the first field effect transistor during normal operation of the integrated circuit.

14. The ESD protection circuit of claim 1, wherein the gate of the first field effect transistor has a first length, wherein the first enabling circuit comprises:

a second field effect transistor connected across the gate of the first field effect transistor and the pad, the second field effect transistor having a gate coupled to the first voltage supply rail, wherein the gate of the second field effect transistor has a second length which is less than the first length.

15. The ESD protection circuit of claim 1, wherein the gate of the first field effect transistor has a first length, wherein the first enabling circuit comprises:

a logic circuit; and a second field effect transistor connected across the gate of the first field effect transistor and the pad, the second field effect transistor having a gate coupled to the logic circuit, wherein the gate of the second field effect transistor has a second length which is less than the first length, and wherein the logic circuit provides a signal to the gate of the second field effect transistor which turns on the second field effect transistor during normal operation of the integrated circuit.

16. The ESD protection circuit of claim 1, wherein the gate of the first field effect transistor has a first length, wherein the first enabling circuit comprises:

a first logic circuit connected to the gate of the first field effect transistor;

a second logic circuit; and a second field effect transistor connected across the gate of the first field effect transistor and the pad, the second field effect transistor having a gate coupled to the second logic circuit, wherein the gate of the second field effect transistor has a second length which is less than the first length, and wherein during normal operation of the integrated circuit the second logic circuit provides a signal to the gate of the second field effect transistor which turns on the second field effect transistor and the first logic circuit provides a signal to control the first field effect transistor.

17. The ESD protection circuit of claim 1, further comprising:

a second voltage supply rail;

a second field effect transistor connected across the pad and the second voltage supply rail, wherein the second field effect transistor provides a conductive path between the pad and the second voltage supply rail by a parasitic bipolar effect when a voltage having a first polarity exists across the pad and the second voltage supply rail; and a second enabling circuit coupled between a gate of the second field effect transistor and the pad, wherein the second enabling circuit turns on the second field effect transistor when a voltage having a second polarity opposite the first polarity and exceeding the preselected voltage exists across the pad and the second voltage supply rail, thereby providing a conductive path between the pad and the second voltage supply rail.

18. An electrostatic discharge (ESD) protection circuit for protecting an integrated circuit fabricated on a chip, the ESD protection circuit comprising:

a pad connected to the integrated circuit to be protected;

a first voltage supply rail;

semiconductor means coupling the pad and the first voltage supply rail, the semiconductor means providing a conductive path between the pad and the first voltage supply rail by a parasitic bipolar effect when an ESD voltage having a first polarity exists across the pad and the first voltage supply rail; and enabling means coupling a control terminal of the semiconductor means and the pad, the enabling means turning on the semiconductor means to provide a conductive path between the pad and the first voltage supply rail when a voltage having a second polarity opposite the first polarity and exceeding a preselected voltage exists across the pad and the first voltage supply rail.

19. A method of protecting an integrated circuit when an electrostatic discharge (ESD) voltage is applied across a pad and a voltage supply rail of the integrated circuit, the method comprising the steps of:

routing current through a field effect transistor by parasitic bipolar effect when the ESD voltage has a first polarity; and turning on the field effect transistor to route current through the field effect transistor when the ESD voltage has a second polarity opposite the first polarity and exceeds a preselected voltage.

* * * * *